(12) United States Patent
Chen et al.

(10) Patent No.: US 11,553,612 B2
(45) Date of Patent: Jan. 10, 2023

(54) FOLDABLE HINGE FOR ELECTRONIC DEVICES

(71) Applicant: HEWLETT-PACKARD DEVELOPMENT COMPANY, L.P., Houston, TX (US)

(72) Inventors: Wei-Chung Chen, Taipei (TW); Kuan-Ting Wu, Taipei (TW); Chi-Hao Chang, Taipei (TW)

(73) Assignee: HEWLETT-PACKARD DEVELOPMENT COMPANY, L.P., Spring, TX (US)

( * ) Notice: Subject to any disclaimer, the term of this patent is extended or adjusted under 35 U.S.C. 154(b) by 1175 days.

(21) Appl. No.: 16/075,755

(22) PCT Filed: Apr. 20, 2017

(86) PCT No.: PCT/US2017/028512
§ 371 (c)(1),
(2) Date: Aug. 6, 2018

(87) PCT Pub. No.: WO2018/194605
PCT Pub. Date: Oct. 25, 2018

(65) Prior Publication Data
US 2021/0207648 A1 Jul. 8, 2021

(51) Int. Cl.
*H05K 5/02* (2006.01)
*G06F 1/16* (2006.01)
(Continued)

(52) U.S. Cl.
CPC ......... *H05K 5/0226* (2013.01); *G06F 1/1681* (2013.01); *E05D 1/04* (2013.01);
(Continued)

(58) Field of Classification Search
CPC ............................ H05K 5/0226; G06F 1/1681
See application file for complete search history.

(56) References Cited

U.S. PATENT DOCUMENTS 8,713,759 B2   5/2014 Cai
9,860,999 B1*  1/2018 Hsu ........................ E05D 3/18
(Continued)

FOREIGN PATENT DOCUMENTS

CN   101099369   1/2008
CN   103021277   4/2013
(Continued)

OTHER PUBLICATIONS

"Lenovo Yoga 3 Pro-Watchband Hinge", Solland, 2017, 5 Pages.

*Primary Examiner* — Abhishek M Rathod
(74) *Attorney, Agent, or Firm* — HPI Patent Department (57) ABSTRACT

A foldable hinge is described herein that includes a plurality of interconnected sliding links, wherein each of the interconnected sliding links comprise at least one curved extruding prong and at least one curved rail. The at least one curved rail of a first interconnected sliding link can be coupled to the at least one curved extruding prong of a second interconnected sliding link to form a torque engine. Additionally, the interconnected sliding links can be rotatable based on a pressure applied to the interconnected sliding links. The foldable hinge can also include a plurality of shafts coupled to the plurality of interconnected sliding links, wherein each shaft is coupled to a separate interconnected sliding link.

16 Claims, 7 Drawing Sheets

(51) Int. Cl.
*E05D 3/18* (2006.01)
*E05D 1/04* (2006.01)

(52) U.S. Cl.
CPC ............ *E05D 3/18* (2013.01); *E05Y 2800/45* (2013.01); *E05Y 2900/606* (2013.01)

(56) References Cited

U.S. PATENT DOCUMENTS

| | | | |
|---|---|---|---|
| 9,870,031 B2* | 1/2018 | Hsu | G06F 1/1681 |
| 9,874,906 B1* | 1/2018 | Hsu | G06F 1/1641 |
| 2007/0117600 A1 | 5/2007 | Robertson et al. | |
| 2010/0232100 A1 | 9/2010 | Fukuma et al. | |
| 2016/0041589 A1 | 2/2016 | Tazbaz | |
| 2016/0083987 A1 | 3/2016 | Xia | |
| 2016/0202736 A1 | 7/2016 | Huang et al. | |
| 2016/0349802 A1 | 12/2016 | Ahn et al. | |
| 2016/0370828 A1* | 12/2016 | Hsu | G06F 1/1652 |
| 2017/0048996 A1* | 2/2017 | Han | H05K 5/0217 |
| 2017/0090523 A1* | 3/2017 | Tazbaz | G06F 1/1654 |
| 2018/0092223 A1* | 3/2018 | Hsu | H04M 1/0268 |

FOREIGN PATENT DOCUMENTS

| | | |
|---|---|---|
| CN | 103620516 | 3/2014 |
| CN | 106537278 | 3/2017 |
| EP | 2573644 A2 | 3/2013 |
| JP | 2016169813 A | 9/2016 |
| KR | 100867608 B1 | 11/2008 |
| WO | 2012167204 A2 | 12/2012 |

* cited by examiner

FOLDABLE HINGE FOR ELECTRONIC DEVICES

BACKGROUND

Many mobile electronic devices have display panels attached to base portions of the mobile electronic devices that include various computing components and input devices. A display panel can be attached to the base portion of the mobile electronic device using various mechanical components. In some examples, the mechanical components can support various viewing angles of the display panel in relation to the base portion of the mobile electronic device.

DESCRIPTION OF THE DRAWINGS

Certain exemplary embodiments are described in the following detailed description and in reference to the drawings, in which.

DETAILED DESCRIPTION

In embodiments described herein, a foldable hinge can attach a display panel to an input device or a base portion of an electronic device. In some embodiments, the base portion of the electronic device can include processors, graphics cards, audio cards, and the like. In some examples, an input device can be included in the base portion of a device. In some embodiments, the devices can be mobile devices and the foldable hinge can enable users to view the display panel from a range of viewing angles. For example, the folding hinge can enable users to rotate a display panel up to 180 degrees in relation to a base portion of an electronic device.

In some embodiments, the foldable hinge can include a torque engine that enables the foldable hinge to rotate the display panel. The torque engine, as referred to herein, can include any suitable number of curved rails and prongs that reside within various sliding links. The sliding links can be interconnected by inserting the extruding prongs of each sliding link into the curved rails of additional sliding links. The interconnected sliding links enable the foldable hinge to be a stretchable or retractable structure that can rotate an attached display device. In some embodiments, a display panel can be attached to the interconnected sliding links with a bracket and any suitable adhesive. For example, the display panel can include a rail structure, such as rails of a bracket, which can adjust the display panel orientation and prevent a broken display panel when rotating the display panel. In some embodiments, the foldable hinge can enable any suitable viewing range of a display panel in relation to a base portion of an electronic device between zero and one-hundred and eighty degrees.

While some embodiments of the foldable hinge are described below in relation to an X axis, Y axis, and Z axis, these axes are shown and used herein for convenience of description and may not reflect an orientation of the device or its components. The description of each axis in relation to various components of a device is used to provide orientation information for each of the components. In an example, the X axis and Y axis are in the plane of the input device or base of an electronic device, while a Z axis is perpendicular to the input device or base of the electronic device. As observed in the figures, when the electronic device is held flat and viewed on edge in front of the viewer, the X axis is in the direction of left-right, and the Y axis is front-back.

Figure 1:
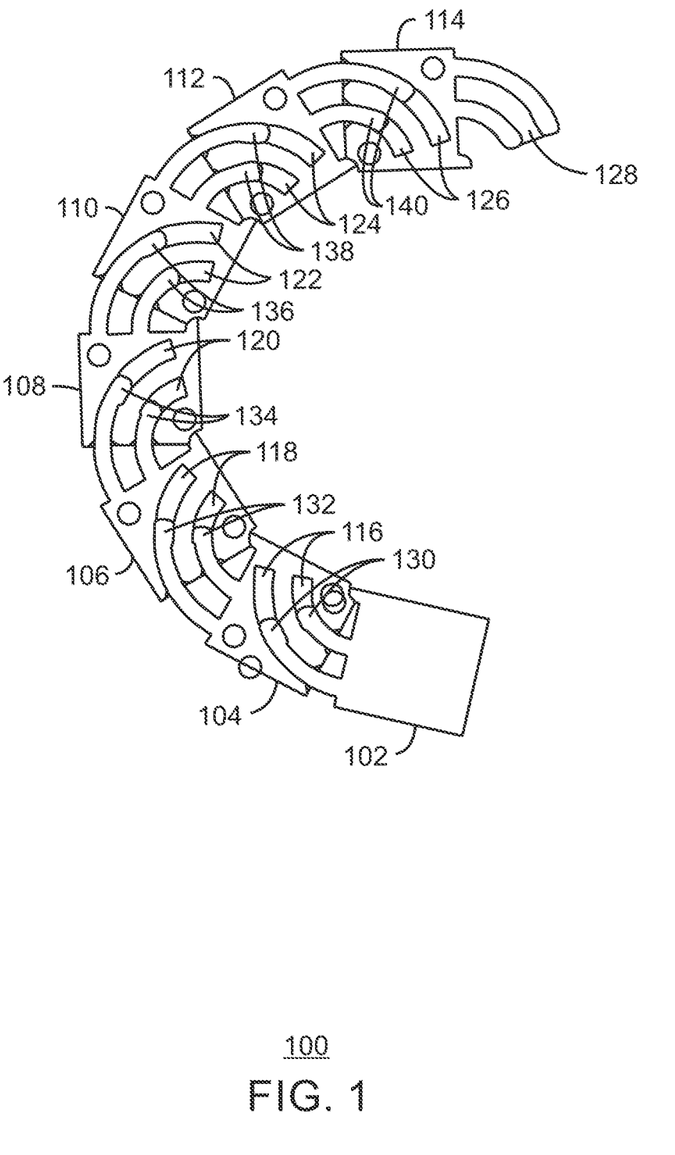
FIG. 1 is a block diagram of an example foldable hinge for attaching a display panel to an electronic device.

FIG. 1 is a block diagram of an example foldable hinge for attaching a display panel to an electronic device. The foldable hinge 100 can include any suitable number of interconnected sliding links 102, 104, 106, 108, 110, 112, and 114. Sliding link 102 may connect or attach to an input device or a base portion of an electronic device (not depicted). In some examples, sliding link 114 can be attached to a display panel. In some embodiments, sliding link 114 can attach to a bracket affixed to a display panel. In some examples, any suitable number of the interconnected sliding links 102, 104, 106, 108, 110, 112, and 114 can include rails 116, 118, 120, 122, 124, 126, and 128 and extruding prongs 130, 132, 134, 136, 138, and 140. The rails 116-128 can be curved at any suitable angle that corresponds to the angles of the extruding prongs 130-140. The angles at which the rails 116-128 and the extruding prongs 130-140 are curved can provide tension as a display panel is moved away from a base portion of a computing device. Accordingly, the rails 116-128 and extruding prongs 130-140, which form the torque engine described herein, can enable a user of an electronic device to view a display panel at up to a one-hundred and eighty degree angle in relation to a base portion of the electronic device. In some embodiments, the plurality of interconnected sliding links 102-114 enable rotation of a display device in a one-hundred and eighty degree range along an axis proximate an edge of the input device or base of an electronic device. A fully extended or open position of the foldable hinge and a fully retracted or closed position of the foldable hinge are described in greater detail below in relation to FIGS. 4 and 5.

It is to be understood FIG. 1 is not intended to indicate that the foldable hinge 100 is to include all of the components discussed above. Rather, the foldable hinge 100 can include fewer components or additional components.

Figure 2:
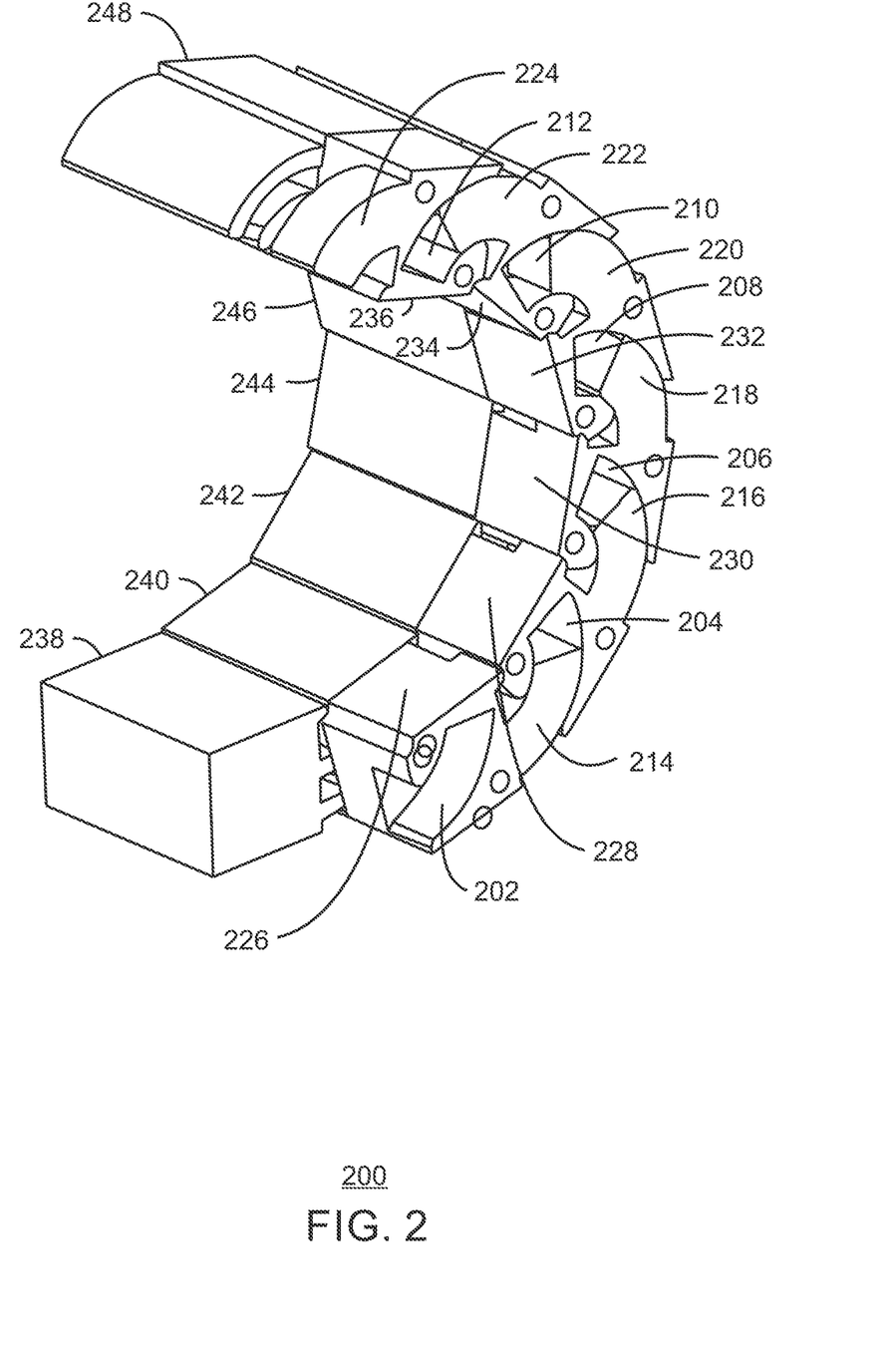
FIG. 2 is a block diagram of an example foldable hinge with several shafts for attaching a display panel to an electronic device.

FIG. 2 is a block diagram of an example foldable hinge with several shafts for attaching a display panel to an electronic device. In some examples, the foldable hinge 200 can include any suitable number of curved rails 202, 204, 206, 208, 210, and 212 and extruding prongs 214, 216, 218, 220, 222, and 224 in sliding links 226, 228, 230, 232, 234, and 236. As discussed above, each of the extruding prongs 214-224 can be inserted into the curved rails 202-212. In some examples, foldable hinge 200 can also include any suitable number of shafts 238, 240, 242, 244, 246, and 248 attached to the sliding links 226-236. The shafts 238-248 can enable any suitable number of sets of interconnected sliding links 226-236 to be connected. The shafts are described in greater detail below in relation to FIGS. 4 and 5. In some embodiments, the extruding prong 224 and shaft 248 can be coupled to a display device and the shaft 240 can be coupled or attached to a base portion of an electronic device.

In some embodiments, the foldable hinge 200 can include any suitable number of interconnected sliding links 226-236. In some examples, the number of interconnected sliding links 226-236 included in the foldable hinge 200 can be dependent upon a depth of each interconnected sliding link 226-236, a depth of the curved rails 202-212, and a length of the extruding prongs 214-224. In some examples, the foldable hinge 200 can include any suitable number of interconnected sliding links 226-236 coupled to any other suitable number of links. For example, the foldable hinge 200 may include links without extruding prongs and curved rails, which can be coupled to any suitable number of sliding links with curved rails and extruding prongs.

It is to be understood FIG. 2 is not intended to indicate that the foldable hinge 200 is to include all of the components discussed above. Rather, the foldable hinge 200 can include fewer components or additional components. Furthermore, the foldable hinge 200 can be included in various devices such as electronic devices and lab instrumentation including sample covers, ports, centrifuge covers, and the like.

Figure 3:
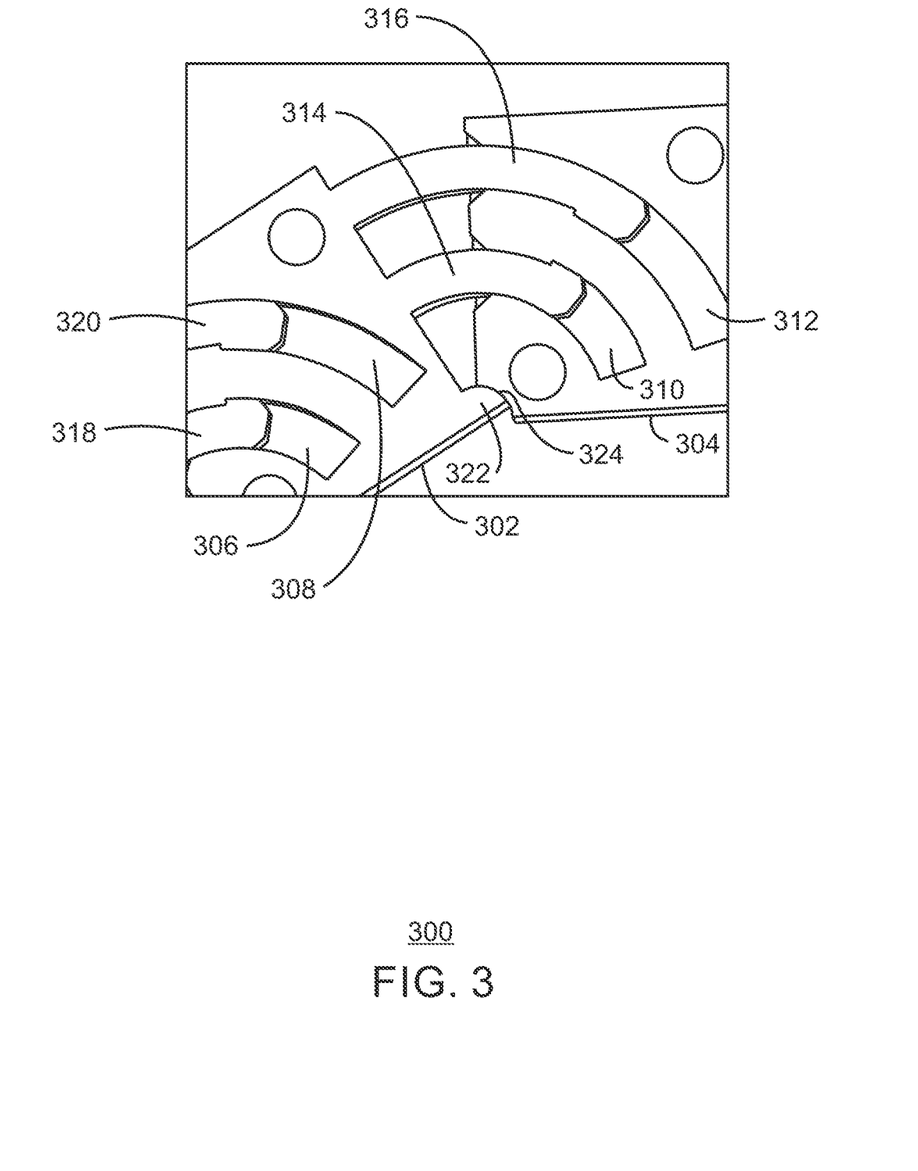
FIG. 3 is a block diagram illustrating an example of interconnected sliding links.

FIG. 3 is a block diagram of example sliding links. In the sliding links 302 and 304 of FIG. 3, each sliding link 302 and 304 can include curved rails 306, 308, 310, and 312. The curved rails 306-312 can be comprised of any suitable material such as stainless steel, plastic, and the like. In some examples, the material of the curved rails can be selected based on an amount of friction generated as pressure forces extruding prongs into the rails. As discussed above, each sliding link 302 and 304 can also include extruding prongs. For example, the sliding link 302 can include extruding prongs 314 and 316. The extruding prongs of sliding link 304 are not included in this figure. Additionally, the curved rails 306 and 308 of sliding link 302 can accept extruding prongs 318 and 320 from an adjacent sliding link that is not illustrated. Each sliding link may also include a ridge and an indention along one side to enable a pivot point between two adjacent sliding links. For example, sliding link 302 includes a ridge 322 and sliding link 304 includes an indention 324. The ridge 322 and the indention 324 enable sliding links 302 and 304 to pivot as extruding prongs 314 and 316 slide into and out of the curved rails 310 and 312.

In FIG. 3, each of the interconnected sliding links comprise two rails to be coupled to two curved extruding prongs. However, it is to be understood that each sliding link could include any suitable number of rails and extruding prongs. Additionally, the rails 306-312 and the extruding prongs 314-320 can interconnect with any suitable angle.

Figure 4:
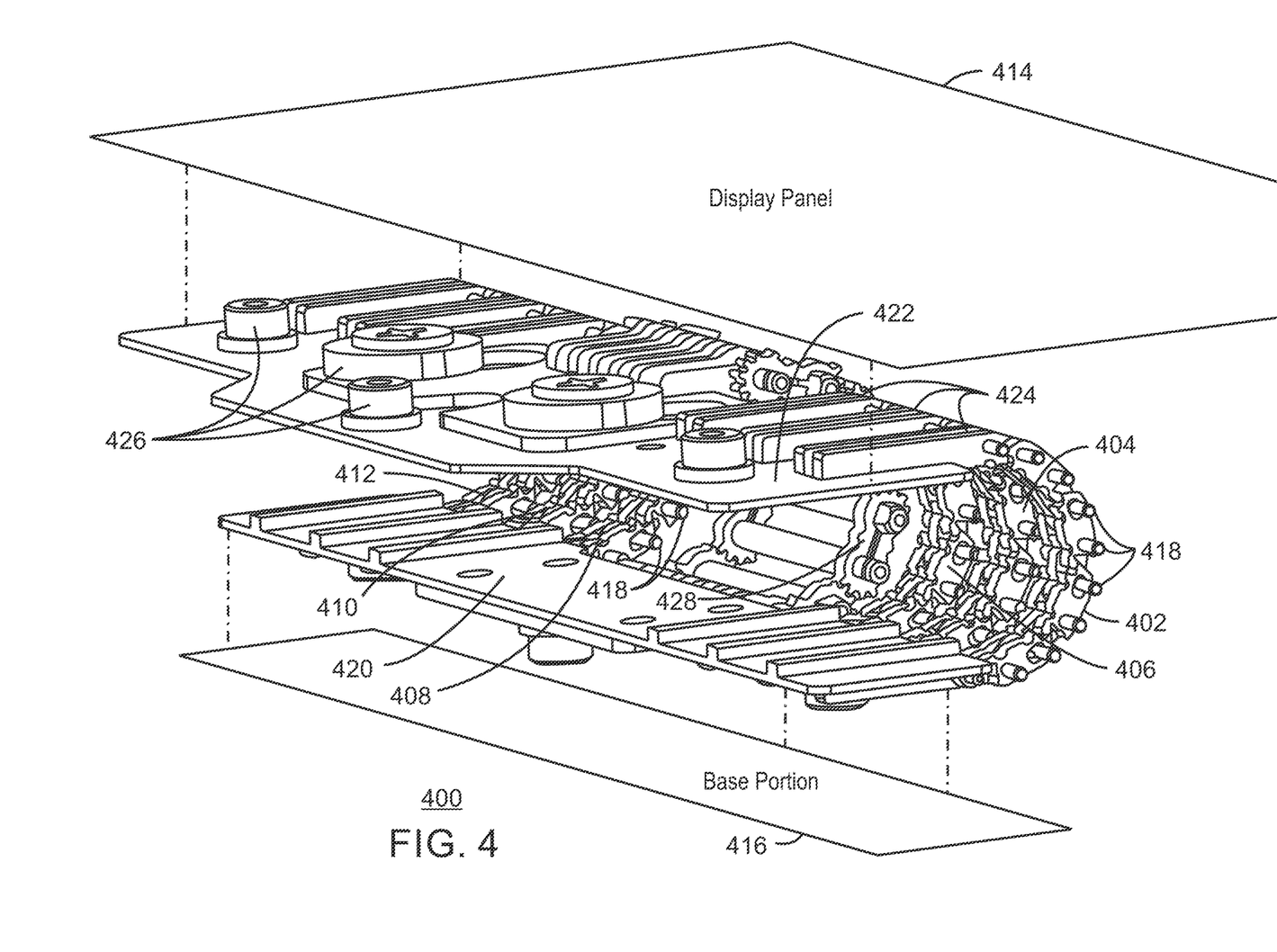
FIG. 4 is a block diagram of an example system with a display panel, base portion of the system, and several foldable hinges in an open position.

FIG. 4 is a block diagram of an example system with a display panel, base portion of the system, and several foldable hinges in an open position. In the system 400 of FIG. 4, six separate sets of interconnected sliding links 402, 404, 406, 408, 410, and 412 can be used to rotate a display panel 414 in relation to a base portion 416 of the system 400. Each of the sets of interconnected sliding links 402-412 can be attached to one another using a plurality of shafts 418. Accordingly, separate sets of interconnected sliding links are attached via the plurality of shafts, wherein each shaft connects to a separate sliding link. In some examples, the sets of interconnected sliding links 402-412 attach to brackets 420 and 422, which connect the interconnected sliding links 402-412 to the display panel 414 and base portion 416 of the system 400 respectively. The brackets 420 and 422 can include any suitable number of channels 424, knobs 426, and the like, to couple the brackets 420 and 422 to the display panel 414 and the base portion 416 of the system 400.

In some embodiments, a set of interconnected gears 428 can also be included in the system 400 between the sets of interconnected sliding links 406 and 408. The set of interconnected gears 428 can provide additional torque or tension to support the display panel 414 in a variety of viewing angles. In some examples, the set of interconnected gears 428 includes a series of two gears that are each coupled by a gear shaft. The set of interconnected gears 428 can be attached to a flexible material such as cloth, any suitable pliable plastic fiber, and the like. In FIG. 4, the plurality of interconnected sliding links 402-412 are to rotate to enable the display panel 414 to be parallel to the base portion 416 of the system, wherein the display panel 414 and the base portion 416 of the system 400 are in separate planes. For example, the display panel 414 (also referred to as a display device) and a base portion 416 of the system 400 can have the same coordinates along an X axis, while having different coordinates along a Z axis. In some examples, the display panel 414 (also referred to as a display device) and base portion 416 of the system 400 can have any suitable number of shared coordinates in the Y axis. In some embodiments, pressure activates the torque engine of a subset of the plurality of interconnected sliding links resulting in the at least one curved extruding prong being inserted into the at least one rail for each of the subset of the interconnected sliding links 402-412. As the sets of interconnected sliding links 402-412 and the set of interconnected gears 428 rotate in response to pressure, an angle between brackets 420 and 422 can be modified resulting in the display panel 414 rotating proximate the base portion 416 of the system 400.

In FIG. 4, the two brackets 420 and 422 are in a fully open state or configuration in which the base portion 416 of the system 400 is parallel to the display panel 414. Accordingly, the sets of interconnected sliding links 402-412 bend at an angle that overlaps the base portion 416 of the system 400. In other words, the sets of interconnected sliding links 402-412 bend at an angle as extruding prongs are inserted into curved rails in the sets of interconnected sliding links 402-412. The angle of the sets of interconnected sliding links 402-412, which is formed by pressure applied to the sets of interconnected sliding links 402-412, forces a bottom edge of the display panel 414 to reside on top of or over the base portion 416 of the system 400. In one example, the bottom edge of the display panel 414 rotates in a z dimensional plane that also includes an input device embedded in the base portion 416 of the system 400. Accordingly, the sets of interconnected sliding links 402-412 form a curved surface approaching the front of the system 400 rather than forming a curved surface that moves away from the rear of the system 400.

It is to be understood FIG. 4 is not intended to indicate that the system 400 is to include all of the components discussed above. Rather, the system 400 can include fewer components or additional components. For example, the system 400 may include fewer sets of interconnected sliding links 402-412 or additional sets of interconnected sliding links 402-412. Additionally, the system 400 may use an asymmetric design in which a set of interconnected gears is adjacent to one interconnected sliding link on one side and two or three interconnected sliding links on the other side. In some embodiments, the set of interconnected gears 428 may not be included in the system 400 if the sets of interconnected sliding links 402-412 provide enough tension to support a display panel 414 at any suitable angle. Furthermore, in some examples, the sets of interconnected sliding links 402-412 may connect directly to a display panel 414 or a base portion 416 of the system 400 without brackets 420 or 422. Accordingly, the system 400 may not include brackets 420 or 422.

Figure 5:
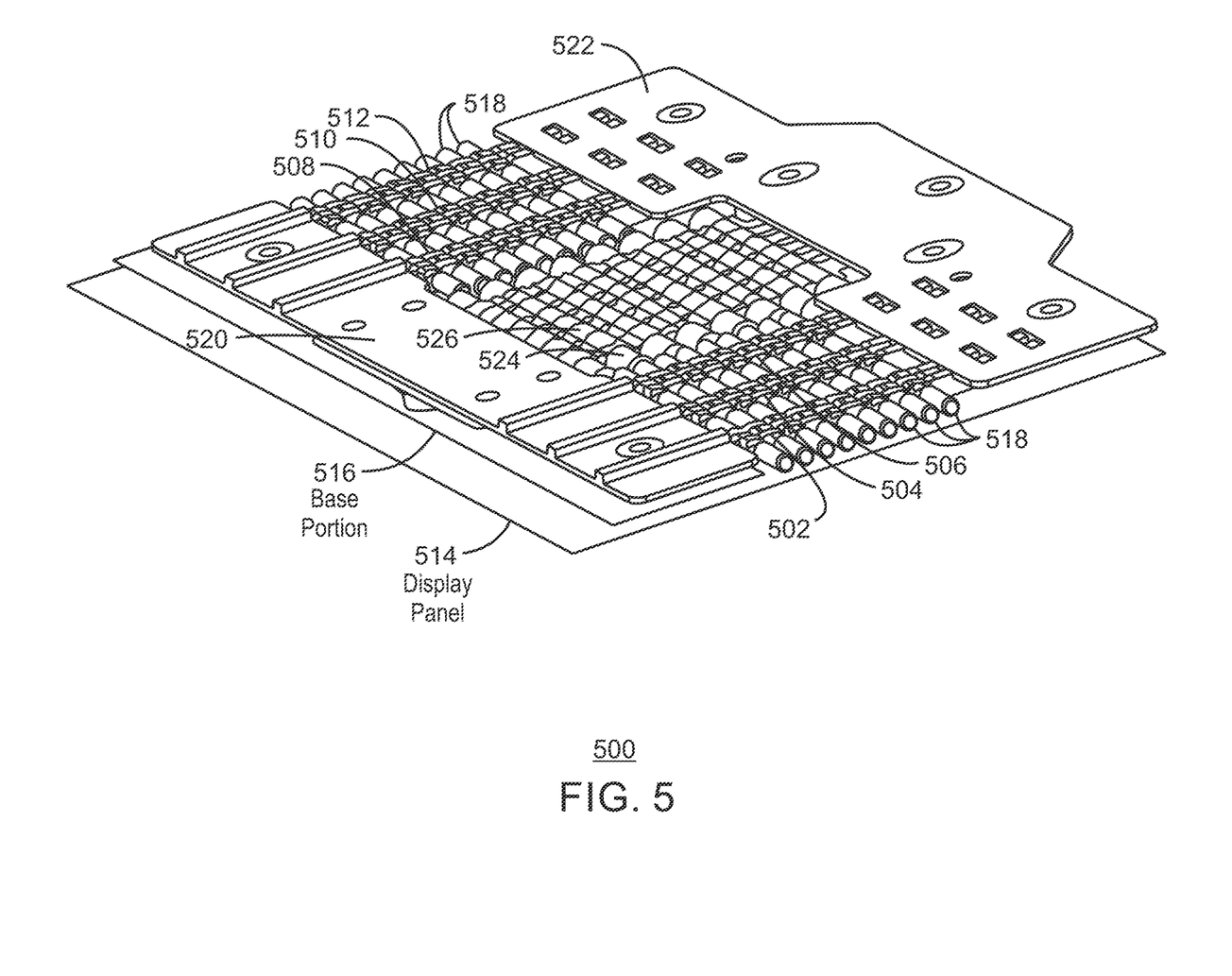
FIG. 5 is a block diagram of an example system with a display panel, base portion of the system, and several foldable hinges in a closed position.

FIG. 5 is a block diagram of an example system with a display panel, base portion of the system, and several foldable hinges in a closed position. In the system 500 of FIG. 5, six separate sets of interconnected sliding links 502, 504, 506, 508, 510, and 512 can be used to rotate a display panel 514 in relation to a base portion 516 of the system 500. Each of the sets of interconnected sliding links 502-512 can be attached to one another using a plurality of shafts 518. In some examples, the sets of interconnected sliding links 502-512 attach to brackets 520 and 522, which connect the interconnected sliding links 502-512 to the display panel 514 and base portion 516 of the system 500 respectively. In some embodiments, a set of interconnected gears 524 and a segment of fabric or any other suitable pliable material 526 can also be included in the system 500 between the sets of interconnected sliding links 506 and 508. The set of interconnected gears 524 can provide additional torque or tension to support the display panel 514 in a variety of viewing angles. In FIG. 5, the plurality of interconnected sliding links 502-512 are to be aligned in a single axis in response to coupling a display device to an input device. The plurality of interconnected sliding links 502-512 can provide tension to prevent the display panel 514 from separating from the base portion 516 of the system 500. In some embodiments, the interconnected sliding links 502-512 are aligned in a single plane or axis along a rear portion of the system 500. For example, the interconnected sliding links 502-512 can reside in a single X-axis plane adjacent to the display panel 514. The interconnected sliding links 502-512 and the display panel 514 can be coupled to the base portion 516 of the system 500 along adjacent planes along the Y-axis.

In some embodiments, each set of interconnected sliding links 502-512 can include any number of sliding links. In some examples, each set of interconnected sliding links 502-512 can include a same number of sliding links. As discussed above, the number of interconnected sliding links 502-512 can be dependent on a depth of each interconnected sliding link 502-512, a depth of the curved rails of the interconnected sliding links 502-512, and a length of the extruding prongs of the interconnected sliding links 502-512.

It is to be understood FIG. 5 is not intended to indicate that the system 500 is to include all of the components discussed above. Rather, the system 500 can include fewer components or additional components. For example, the system 500 may include fewer sets of interconnected sliding links 502-512 or additional sets of interconnected sliding links 502-512. Additionally, the system 500 may use an asymmetric design in which a set of interconnected gears is adjacent to one interconnected sliding link on one side and two or three interconnected sliding links on the other side. In some embodiments, the set of interconnected gears 524 may not be included in the system 500 if the sets of interconnected sliding links 502-512 provide enough tension to support a display panel 514 at any suitable angle.

Figure 6:
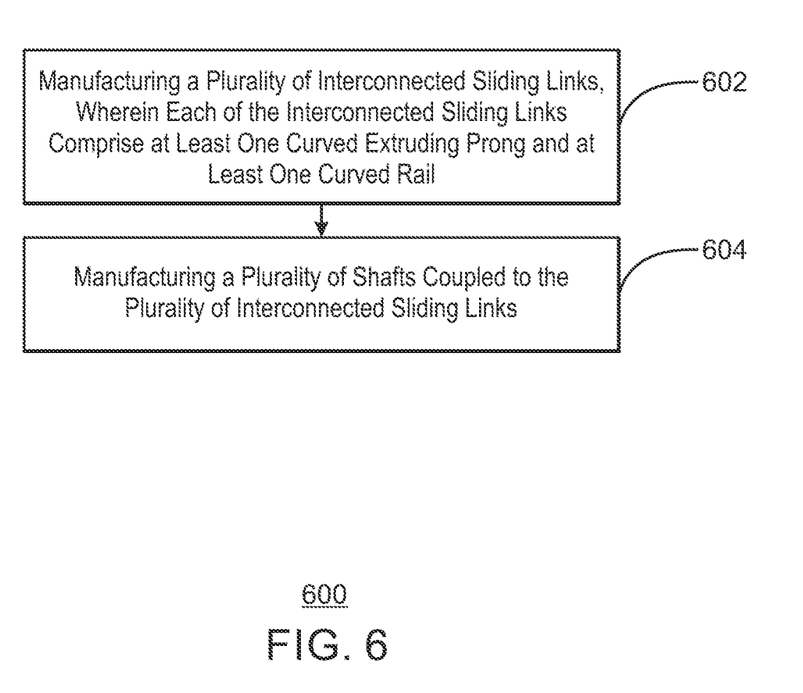
FIG. 6 is a process flow diagram for manufacturing a foldable hinge.

FIG. 6 is a process flow diagram for manufacturing a foldable hinge. The process 600 can be implemented by any suitable manufacturing technique.

At block 602, the process 600 can include manufacturing a plurality of interconnected sliding links, wherein each of the interconnected sliding links comprise at least one curved extruding prong and at least one curved rail. As discussed above, the at least one curved rail of a first interconnected sliding link is coupled to the at least one curved extruding prong of a second interconnected sliding link forming a torque engine. In some embodiments, the interconnected sliding links are rotatable based on a pressure applied to the interconnected sliding links. The extruding prongs and curved rails of the plurality of interconnected sliding links can be curved at any suitable angle to enable the plurality of interconnected sliding links to rotate at any suitable angle. In some examples, the angle of rotation of the plurality of interconnected sliding links can be dependent on the curvature of the extruding prongs and the curved rails, the depth of the interconnected sliding links, and the number of interconnected sliding links. In some examples, the process 600 can detect the number of interconnected sliding links to manufacture based on a number of interconnected sliding links that results in a one-hundred and eighty degree rotation of a display panel in relation to a base portion of an electronic device.

At block 604, the process 600 can also include manufacturing a plurality of shafts coupled to the plurality of interconnected sliding links, wherein each shaft is coupled to a separate interconnected sliding link. As illustrated above in relation to FIGS. 4 and 5, each shaft can connect any suitable number of sets of interconnected sliding links. For example, each shaft can connect sliding links from two, three, or any other suitable number of sets of interconnected sliding links that reside parallel to one another. In some embodiments, a device can include multiple sets of shafts that connect separate groups of interconnected sliding links. For example, a first set of shafts may connect two or three sets of interconnected sliding links and a second set of shafts may connect two or three different sets of interconnected sliding links. A device may include multiple sets of shafts if the device includes features between sets of interconnected sliding links. For example, a set of gears may be included between two sets of interconnected sliding links, which can prevent a set of shafts from connecting interconnected sliding links on either side of the set of gears.

The description of process 600 in FIG. 6 is not intended to indicate that blocks 602 and 604 are to be executed in any particular order. In some examples, block 604 can be executed prior to block 602. Furthermore, the process 600 may include any number of additional blocks. For example, the process 600 can also include manufacturing two brackets, wherein each bracket attaches to opposite ends of the interconnected sliding links. The brackets can be used to mount a display panel and a base portion of an electronic device to the interconnected sliding links. Additionally, the process 600 can also include manufacturing a set of gears to reside between multiple sets of interconnected sliding links, as illustrated above in relation to FIGS. 4 and 5. In some examples, the process 600 can also include manufacturing any suitable pliable fabric or plastic to cover gear shafts included in the set of gears.

In some embodiments, the set of interconnected sliding links can be combined with non-interconnected sliding links. For example, a foldable hinge may include interconnected sliding links in the center surrounded by non-interconnected sliding links. The non-interconnected sliding links may bend and rotate using any suitable technique without extruding prongs and curved rails.

Figure 7:
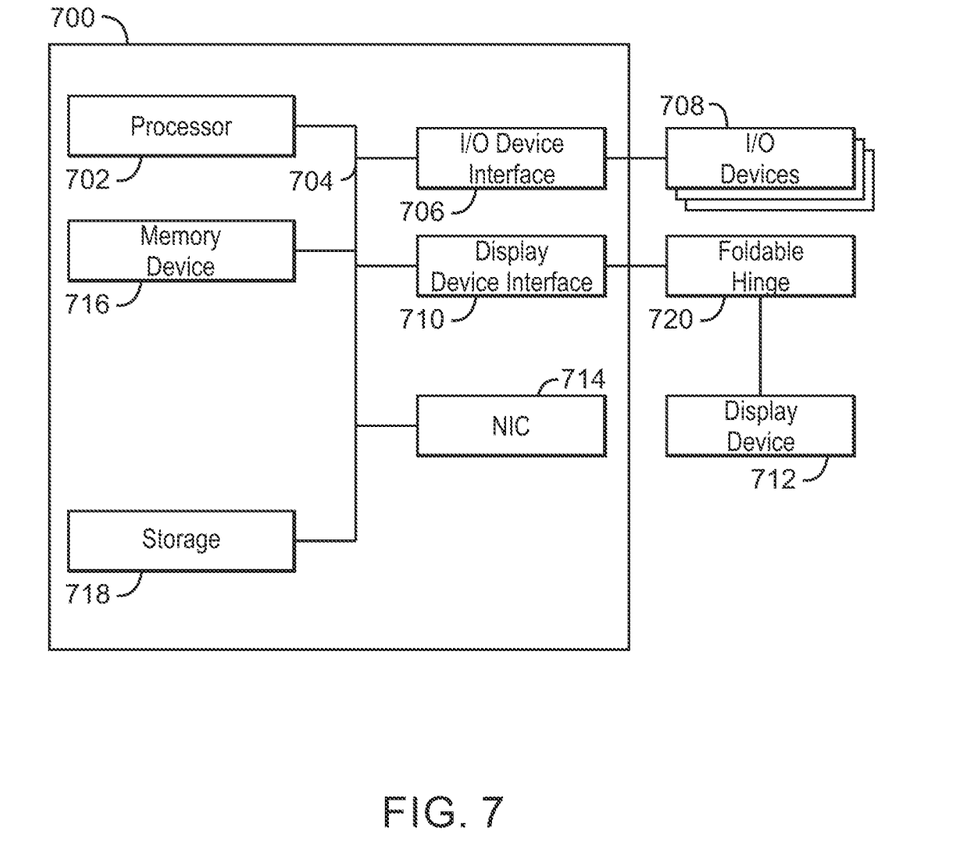
FIG. 7 is a block diagram of an example computing system that includes a foldable hinge.

FIG. 7 is a block diagram of an example computing system that includes a foldable hinge. The computing system 700 may include, for example, a server computer, a mobile phone, laptop computer, desktop computer, or tablet computer, among others. The computing system 700 may include a processor 702 that is adapted to execute stored instructions. The processor 702 can be a single core processor, a multi-core processor, a computing cluster, or any number of other appropriate configurations.

The processor 702 may be connected through a system bus 704 (e.g., AMBA®, PCI®, PCI Express®, Hyper Transport®, Serial ATA, among others) to an input/output (I/O) device interface 706 adapted to connect the computing system 700 to one or more I/O devices 708. The I/O devices 708 may include, for example, a keyboard and a pointing device, wherein the pointing device may include a touchpad or a touchscreen, among others. The I/O devices 708 may be built-in components of the computing system 700, or may be devices that are externally connected to the computing system 700.

The processor 702 may also be linked through the system bus 704 to a display device interface 710 adapted to connect the computing system 700 to display device 712. The display device 712 may include a display screen that is a built-in component of the computing system 700. The display device 712 may also include computer monitors, televisions, or projectors, among others, that are externally connected to the computing system 700. Additionally, the processor 702 may also be linked through the system bus 704 to a network interface card (also referred to herein as NIC) 714. The NIC 714 may be adapted to connect the computing system 700 through the system bus 704 to a network (not depicted). The network may be a wide area network (WAN), local area network (LAN), or the Internet, among others.

The processor 702 may also be linked through the system bus 704 to a memory device 716. In some examples, the memory device 716 can include random access memory (e.g., SRAM, DRAM, eDRAM, EDO RAM, DDR RAM, RRAM®, PRAM, among others), read only memory (e.g., Mask ROM, EPROM, EEPROM, among others), non-volatile memory (PCM, STT_MRAM, ReRAM, Memristor), or any other suitable memory systems. In some embodiments, the processor 702 may also be linked through the system bus 704 to a storage device 718. The storage device 718 can include any suitable number of software modules or applications.

In some embodiments, a foldable hinge 720 attaches the display device 712 to the computing system 700. For example, as discussed above, the foldable hinge 720 can include any suitable number of interconnected sliding links that couple to one another with extruding prongs and curved rails. In some embodiments, the display device 712 can be attached to the computing system 700 with any number of foldable hinges 720. In some examples, the computing system 700 is a base portion of a system that is attached to a display device 712 via the foldable hinge 720.

When the display device 712 is separated or pulled away from the computing system 700 in an open position, the foldable hinge 720 can provide torque or tension to support the display device 712 in a variety of viewing angles. A plurality of interconnected sliding links in the foldable hinge 720 can rotate to enable the display device 712 to be parallel to the computing system 700, wherein the computing system 700 and display device 712 are in separate planes. For example, the display device 712 and the computing system 700 can have the same coordinates along an X axis, while having different coordinates along a Z axis. In some examples, the display device 712 and computing system 700 can have any suitable number of shared coordinates in the Y axis. Accordingly, a portion of the display device 712 may overlap a portion of the computing system 700 in an open state. In some embodiments, pressure activates the torque engine of a subset of the plurality of interconnected sliding links in the foldable hinge 720 resulting in at least one curved extruding prong being inserted into at least one rail for each of the subset of the interconnected sliding links. As the sets of interconnected sliding links of the foldable hinge 720 rotate in response to pressure, an angle between the display device 712 and the computing system 700 can be modified.

When the display device 712 is coupled to the computing system 700 in a closed position, the foldable hinge 720 can provide torque or tension to maintain a closed position. For example, the foldable hinge 720 can include sets of interconnected sliding links that can be attached to one another using a plurality of shafts. In some examples, the sets of interconnected sliding links of the foldable hinge 720 are connected to the display device 712 and the computing system 700. In some embodiments, the foldable hinge 720 can also include a set of interconnected gears that provide additional torque or tension to keep the display device 712 coupled to the computing system 700. In a closed position, the foldable hinge 720 is aligned in a single axis in response to coupling the display device 712 to the computing system 700.

In some embodiments, the foldable hinge 720 can include any number of sets of interconnected sliding links that can include any number of sliding links. In some examples, each set of interconnected sliding links of the foldable hinge 720 can include a same number of sliding links. As discussed above, the number of interconnected sliding links of the foldable hinge 720 can be dependent on a depth of each interconnected sliding link, a depth of the curved rails of the interconnected sliding links, and a length of the extruding prongs of the interconnected sliding links.

It is to be understood that the block diagram of FIG. 7 is not intended to indicate that the computing system 700 is to include all of the components shown in FIG. 7. Rather, the computing system 700 can include fewer or additional components not illustrated in FIG. 7 (e.g., additional memory devices, video cards, additional network interfaces, sets of gears in the foldable hinge, additional foldable hinges, etc.).

While the present techniques may be susceptible to various modifications and alternative forms, the techniques discussed above have been shown by way of example. It is to be understood that the technique is not intended to be limited to the particular examples disclosed herein. Indeed, the present techniques include all alternatives, modifications, and equivalents falling within the scope of the following claims.

What is claimed is:

1. A foldable hinge comprising:
  a set of links comprising a plurality of interconnected sliding links, wherein:
    each of the interconnected sliding links comprise a ridge, an indention, at least two curved extruding prongs, and at least two curved rails, wherein:
      the ridge of a first interconnected sliding link is coupled to the indention of a second interconnected sliding link to allow a pivot point between adjacent interconnected sliding links;
      the at least two curved rails of the first interconnected sliding link are coupled to the at least two curved extruding prongs of the second interconnected sliding link forming a torque engine;
      a quantity of interconnected sliding links in the plurality of interconnected sliding links is dependent upon a depth of each interconnected sliding link, a depth of each curved rail, and a length of each curved extruding prong; and the interconnected sliding links are rotatable based on a pressure applied to the interconnected sliding links;

a plurality of shafts coupled to the plurality of interconnected sliding links, wherein each shaft couples the set of links to another adjacent separate set of links, wherein the set of links and adjacent separate set of links include the same quantity of interconnected sliding links; and a bracket coupled to a first end of the plurality of interconnected sliding links and a base portion.

2. The foldable hinge of claim 1, wherein the plurality of interconnected sliding links are coupled to a display device, via a second end of the plurality of interconnected sliding links, and an input device, via the first end of the plurality of interconnected sliding links, wherein the input device is connected to the base portion.

3. The foldable hinge of claim 2, wherein the plurality of interconnected sliding links enable rotation of the display device in a 180 degree range along an axis proximate an edge of the input device.

4. The foldable hinge of claim 2, wherein the curved rails of the interconnected sliding links comprise stainless steel.

5. The foldable hinge of claim 2, wherein the plurality of interconnected sliding links are to rotate to enable the display device to be parallel to the input device, wherein the display device and the input device are in separate planes.

6. The foldable hinge of claim 2, wherein the pressure activates the torque engine of a subset of the plurality of interconnected sliding links resulting in the at least two curved extruding prongs being inserted into the at least two rails for each of the subset of the interconnected sliding links.

7. The foldable hinge of claim 1, wherein the plurality of interconnected sliding links are to be aligned in a single axis in response to coupling, via the interconnected sliding links, a display device to an input device.

8. The foldable hinge of claim 1, wherein each shaft of the plurality of shafts connects to a separate sliding link of the set of links and connects to a separate sliding link of the adjacent separate set of links.

9. The foldable hinge of claim 1, wherein the plurality of shafts comprises a first set of shafts connected to a first plurality of sets of interconnected sliding links and a second set of shafts connected to a second different plurality of sets of interconnected sliding links.

10. The foldable hinge of claim 1, wherein while the foldable hinge is aligned in a single axis the foldable hinge is in a closed position and while the foldable hinge is transitioned from an open position to the closed position the at least two curved extruding prongs of the second interconnected sliding link are inserted into the at least two curved rails of the first interconnected sliding link.

11. A method for manufacturing a foldable hinge comprising:

manufacturing a set of links comprising a plurality of interconnected sliding links, wherein each of the interconnected sliding links comprise a ridge, an indention, at least two curved extruding prongs and at least two curved rails, wherein:

the ridge of a first interconnected sliding link is coupled to the indention of a second interconnected sliding link to allow a pivot point between adjacent interconnected sliding links;

the at least two curved rails of the first interconnected sliding link is coupled to the at least two curved extruding prongs of the second interconnected sliding link forming a torque engine;

a quantity of interconnected sliding links in the plurality of interconnected sliding links is dependent upon a depth of each interconnected sliding link, a depth of each curved rail, and a length of each curved extruding prong; and the interconnected sliding links are rotatable based on a pressure applied to the interconnected sliding links;

manufacturing a plurality of shafts coupled to the plurality of interconnected sliding links, wherein each shaft couples the set of links of the plurality of interconnected sliding links to another adjacent separate set of links of a separate plurality of interconnected sliding links, wherein the set of links of the plurality of interconnected sliding links and the adjacent separate set of links of the separate plurality of interconnected sliding links include the same quantity of interconnected sliding links; and manufacturing a bracket coupled to a first end of the plurality of interconnected sliding links and a base portion.

12. The method of claim 11, further comprising:

coupling a display device to the plurality of interconnected sliding links via a second end of the plurality of interconnected sliding links; and coupling an input device to the plurality of interconnected sliding links via a first end of the plurality of interconnected sliding links, wherein the input device is connected to the base portion.

13. The method of claim 11, wherein the plurality of interconnected sliding links enable rotation of a display device in a 180 degree range along an axis proximate an edge of a input device.

14. The method of claim 11, wherein the curved rails of the interconnected sliding links comprise stainless steel.

15. A system comprising a foldable hinge comprising:

a set of links comprising a plurality of interconnected sliding links, wherein:

each of the interconnected sliding links comprise a ridge, an indention, at least two curved extruding prongs and at least two curved rails, wherein:

the ridge of a first interconnected sliding link is coupled to the indention of a second interconnected sliding link to allow a pivot point between adjacent interconnected sliding links;

the at least two curved rails of the first interconnected sliding link is coupled to the at least two curved extruding prongs of the second interconnected sliding link forming a torque engine;

a quantity of interconnected sliding links in the plurality of interconnected sliding links is dependent upon a depth of each interconnected sliding link, a depth of each curved rail, and a length of each curved extruding prong; and the interconnected sliding links are rotatable based on a pressure applied to the interconnected sliding links;

a plurality of shafts coupled to the plurality of interconnected sliding links, wherein each shaft couples the set of links to another adjacent separate set of links, wherein the set of links and the adjacent separate set of links include the same quantity of interconnected sliding links;

a first bracket coupled to a first end of the plurality of interconnected sliding links and a base portion;

a display panel coupled to the interconnected sliding links via a second bracket coupled to a second end of the plurality of interconnected sliding links; and an input device coupled to the interconnected sliding links.

16. The system of claim 15, wherein the plurality of interconnected sliding links are to rotate to enable the display device to be parallel to the input device, wherein the display device and the input device are in separate planes.

* * * * *